United States Patent [19]
Johannsmeier

[11] 3,941,294
[45] Mar. 2, 1976

[54] WIRE BONDING APPARATUS WITH IMPROVED Z-AXIS MOTION CONTROL

[75] Inventor: Karl-Heinz Johannsmeier, Los Altos, Calif.

[73] Assignee: Automated Equipment Corporation, Mountain View, Calif.

[22] Filed: Mar. 5, 1974

[21] Appl. No.: 448,251

[52] U.S. Cl............... 228/4.5; 228/6 A; 74/471 XY
[51] Int. Cl.² .................. B23K 19/00; B23K 37/02
[58] Field of Search............ 228/3, 4, 5, 6, 3.1, 4.5, 228/5.1; 74/471 R, 471 XY

[56] References Cited
UNITED STATES PATENTS

| | | | |
|---|---|---|---|
| 3,149,510 | 9/1964 | Kulicke | 74/471 X |
| 3,474,685 | 10/1969 | Miller | 74/471 X |
| 3,489,027 | 1/1970 | Christy | 228/3 X |
| 3,813,022 | 5/1974 | Radobenko | 228/3 |

*Primary Examiner*—James L. Jones, Jr.
*Assistant Examiner*—K. J. Ramsey
*Attorney, Agent, or Firm*—Roland I. Griffin

[57] ABSTRACT

A support arm for a wire bonding tool is fixedly mounted at one end on a first horizontal X-Y stage and is attached at the other end to a swing block by a pair of flexible reeds. The wire bonding tool is mounted on the swing block by another pair of flexible reeds. Both pairs of flexible reeds are arranged to permit vertical motion of the wire bonding tool along a Z-axis toward and away from a workpiece supported beneath the wire bonding tool on a second horizontal X-Y stage. A bell crank is coupled between the support arm and the swing block and is operated by a push rod to control the vertical Z-axis motion of the wire bonding tool. The push rod is coupled at one end to the bell crank and at the other end to a lower coupling member rotatably mounted on the first X-Y stage as part of an Oldham coupling mechanism. An upper coupling member of this Oldham coupling mechanism is rotatably mounted on a support bracket adjacent to the first X-Y stage. The upper coupling member is operated by a cam-controlled linkage mechanism to rotate the lower coupling member and thereby move the push rod as required to operate the bell crank and control the vertical Z-axis motion of the wire bonding tool.

20 Claims, 12 Drawing Figures

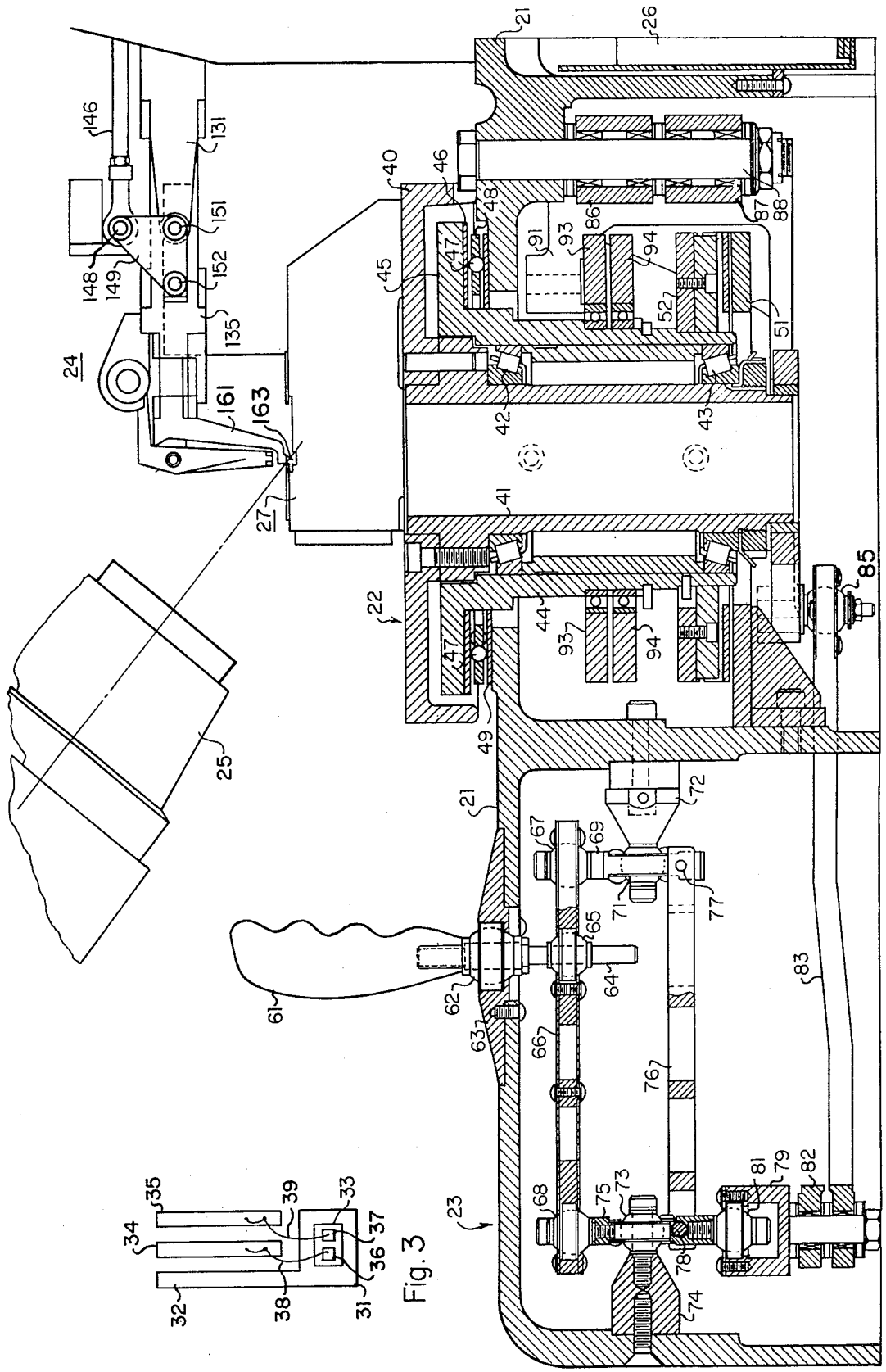

WIRE BONDING APPARATUS WITH IMPROVED Z-AXIS MOTION CONTROL

CROSS-REFERENCE TO RELATED APPLICATION

The subject matter of this patent application is related to that of U.S. Pat. application Ser. No. 264,354 entitled WIRE BONDER APPARATUS, filed on June 19, 1972, by William Radobenko, issued on May 28, 1974, as U.S. Pat. No. 3,813,022 and assigned to the same assignee as this patent application.

BACKGROUND OF THE INVENTION

This invention relates generally to assembly tools, such as wire bonding machines, and more particularly to an improved mechanism for controlling the vertical Z-axis motion of an element such as a wire bonding tool of a wire bonding machine.

In present day transistor manufacturing technology, a transistor die is bonded to a base member in a transistor frame or header, a metallic terminal member extending out from the base member of the frame serving as an electrical terminal for electrical connection to the die. The transistor frame is provided with two additional metallic terminal members extending from the proximity of the base member. During manufacture of the transistor, electrical connections must be made between these two additional electrical terminal members and two associated bonding pads on the die. The last-mentioned electrical connections are made with thin wire, such as one mil gold wire, by an operator manipulating a wire bonding machine over the transistor unit as described below.

A wire bonding tool of the wire bonding machine and the associated wire fed to the bonding tool from a spool are initially positioned over a first one of the bonding pads on the die and are then lowered to bond the end of the wire to the first bonding pad. The bonding tool and the wire are then raised from the first bonding pad and moved to the associated first terminal member where the bonding tool and the wire are lowered again to form a first wire bond to the first terminal member, the wire being fed through the bonding tool and looped over the distance between the bonding point on the first bonding pad and the new bonding point on the first terminal member. Following this first wire bond on the first terminal member, the bonding tool and the wire are raised again, moved a short distance, and lowered again to form an additional loop and a second wire bond to the first terminal member. These two wire bonds to the first terminal member with the wire stitched in between provide a high reliability electrical contact.

The wire is then broken or cut to free the wire and permit the bonding tool and the wire to be raised and positioned over the second bonding pad on the die where the next wire bond is then made by lowering the bonding tool and the wire. Thereafter, the bonding tool is moved and the wire looped over the associated second terminal member where two wire bonds with a wire stitch therebetween are formed in the same manner as described above in connection with the first terminal member. The wire is then cut or broken and the next transistor unit moved into position to permit the desired electrical connections between the two bonding pads on the next transistor die and their associated first and second terminal members to be formed.

Wire bonding machines such as that described above require a great deal of manual manipulation by the operator in moving the bonding tool and the wire from bonding point to bonding point. This is a relatively slow process and is very tiring on the operator. In the above-referenced patent application a wire bonding machine is disclosed which, once the bonding tool is initially positioned over the first bonding pad on the die, will thereafter automatically perform all of the aforementioned wire bonding, stitching, and breaking operations. Since all of these operations are performed automatically, the required electrical connections for each transistor unit may be completed very fast and with very little effort on the part of the operator once the wire bonding tool is initially aligned over the first bonding pad on the die. If the transistor units are automatically fed in an indexed manner to the wire bonding machine, a great many transistor dice may be bonded without additional manipulation on the part of the operator. For example, as many as ten thousand separate bonds may be made in 1 hour. In order to achieve such a high bonding rate with high reliability, it is very important that the raising and lowering of the wire bonding tool along the vertical Z axis of the wire bonding machine be precisely controlled due to the small size of the bonding pads on the dice and of their associated terminal members.

SUMMARY OF THE INVENTION

In accordance with the preferred embodiment of this invention, an automatic wire bonding machine like that disclosed in the above-referenced patent application is provided with an improved vertical Z-axis motion control mechanism. As disclosed in the above-referenced patent application, a support arm is fixedly mounted at one end on a first horizontal X-Y stage and is attached at the other end by a pair of flexible reeds to a swing block on which a wire bonding tool is mounted by another pair of flexible reeds. These pairs of flexible reeds are arranged to permit motion of the wire bonding tool along a vertical Z axis towards and away from a transistor unit or some other such workpiece supported beneath the wire bonding tool on a second horizontal X-Y stage. A bell crank is pivotally coupled between the support arm and the swing block and is operated by a push rod to control the vertical Z-axis motion of the wire bonding tool.

In accordance with the preferred embodiment of the improved vertical Z-axis motion control mechanism, the push rod is pivotally coupled at one end to the bell crank and is pivotally coupled at the other end to a lower coupling member rotatably mounted on the first X-Y stage. The lower coupling member, an intermediate coupling member, and an upper coupling member rotatably mounted on a support bracket adjacent to the first X-Y stage form an Oldham coupling permitting movement of the first X-Y stage in an X-Y coordinate system to adjust the horizontal position of the wire bonding tool without rotating the upper or lower coupling members and, hence, without affecting the vertical position of the wire bonding tool along the coordinate Z axis. A linkage mechanism is pivotally coupled to the upper coupling member and operated by a cam to rotate the lower coupling member and thereby move the push rod as required to operate the bell crank and control the vertical Z-axis motion of the wire bonding tool.

DESCRIPTION OF THE DRAWINGS

FIG. 2 is a side view of the wire bonding machine of FIG. 1 with the micromanipulator and sub-base assembly shown in cross-section.

FIG. 3 is a top view of a typical transistor unit to which wire bonds are to be made.

DESCRIPTION OF THE PREFERRED EMBODIMENT

Figure 1:
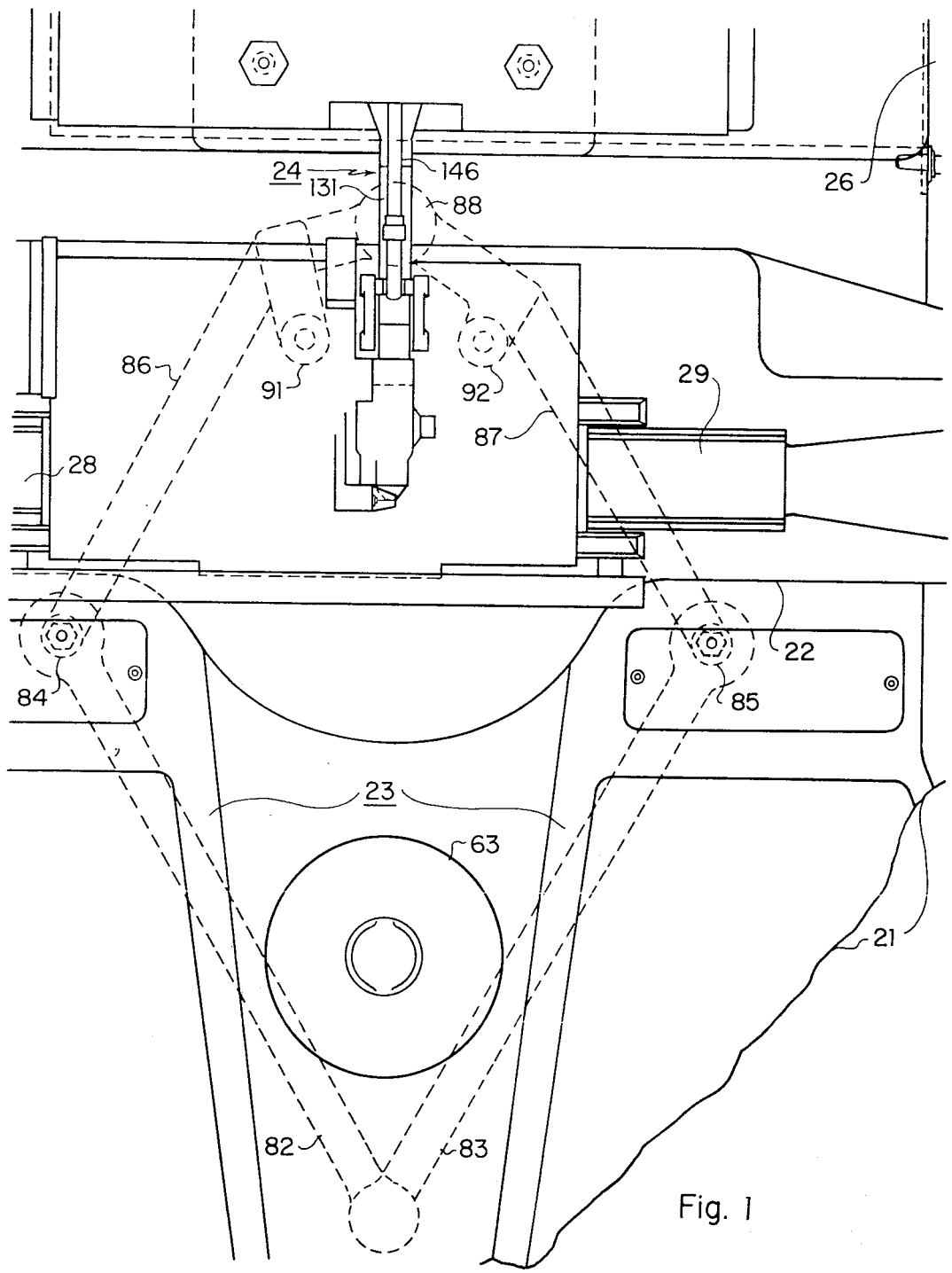
FIG. 1 is a top view of a wire bonding machine incorporating a Z-axis motion control mechanism according to the preferred embodiment of this invention.

Referring now to FIGS. 1 and 2, the wire bonding machine comprises a housing, a main base structure 21 of which carries thereon a swivel sub-base assembly 22, a micromanipulator mechanism 23 for moving the swivel sub-base assembly, a wire bonding tool holder mechanism 24, a microscope 25, and an electronic logic control compartment 26. The swivel sub-base assembly 22 supports thereon a transistor strip indexing mechanism 27 including a transistor strip heater unit and left and right-hand transistor strip magazine holders 28 and 29, respectively.

The operator first places a transistor strip magazine (not shown) holding a plurality (for example, 10) multi-unit transistor strips in stacked relationship therein on the left-hand transistor strip magazine holder 28 and places an empty transistor strip magazine (not shown) on the right-hand transistor strip magazine holder 29. A first transistor strip is fed by the operator onto the transistor strip indexing mechanism 27, which is similar to that shown in U.S. Pat. No. 3,695,501 entitled Die Bonder Apparatus and issued on Oct. 3, 1972. The operator operates the transistor strip indexing mechanism 27 to bring the die of the first transistor unit on the first transistor strip under a capillary wire bonding tip 163 held by a bonding tool holder 161 of the wire bonding tool holder mechanism 24 and operates the swivel sub-base assembly 22 with the micromanipulator mechanism 23 to bring the first bonding pad of the die directly under the capillary wire bonding tip 163 in preparation for the first wire bond.

The micromanipulator mechanism 23 comprises a handle 61 mounted on a spherical bearing 62 in a bearing bracket 63 secured to the upper portion of the main base structure 21, the underside of handle 61 being provided with a joy stick slide pin 64. Slide pin 64 extends through a central cylindrical opening or bore in a spherical bearing 65 carried in an upper link 66 that is provided with a pair of spherical bearings 67 and 68 at its two ends. One end of the upper link 66 is coupled via a coupling link 69 and a spherical bearing 71 to a fixed anchor or pivot mounting member 72 secured to the main base structure 21. The other end of the upper link 66 is coupled via another coupling link 75 and another spherical bearing 73 to another fixed anchor or pivot mounting member 74 secured to the main base structure 21. The lower ends of the two coupling links 69 and 75 are coupled together via a manipulator yoke member 76 and associated pivot pins 77 and 78, respectively.

The lower end of the coupling link 75 is also coupled to a pantograph pivot 79 having a pivot shaft on which each one of two off-set manipulator links or arms 82 and 83 is rotatably positioned at one end thereof. The opposite ends of these two manipulator links 82 and 83, which form a portion of a pantograph, carry spherical bearings 84 and 85 including shaft portions rotatably coupled to the spatially separated ends of two additional offset manipulator links 86 and 87, respectively. Each of these two additional manipulator links 86 and 87 is rotatably mounted at its opposite end on a shaft 88 secured in the main base structure 21. Extension arms 91 and 92 of the two additional manipulator links 86 and 87, respectively, are pivotally secured to two associated manipulator rings 93 and 94, respectively, encircling and rotatably mounted upon a hollow cylindrical main spindle 44.

A single typical transistor unit of the type carried on the multi-unit transistor strip is illustrated in FIG. 3. It includes a base member 31 having a transistor die 33 bonded thereto, a terminal member 32 extending out from the base member, and two separate terminal members 34 and 35 positioned adjacent to the base member. The die 33 has two bonding pads 36 and 37 thereon. A first wire connection 38 is to be made between the bonding pad 36 and the terminal member 34, and a second wire connection 39 is to be made between the bonding pad 37 and the terminal member 35. One bond is to be made at each of the bonding pads 36 and 37 and two stitch bonds at each of the terminal members 34 and 35.

The swivel sub-base assembly 22 includes a sub-base plate 40 mounted on a manipulator main shaft 41 which is in turn mounted via two spaced-apart bearings 42 and 43 in the hollow cylindrical main spindle 44. An annular flange 45 is provided at the upper end of the main spindle 44. The lower surface of this flange 45 is provided with an annular spindle ring 46 resting upon a plurality of ball bearings 47 held in a ball retainer ring 48, the ball bearings in turn resting upon an annular base ring 49 mounted on the upper surface of the main base structure 21. The spindle mechanism is provided with a pair of X and Y-axes antirotation ring members 51 and 52 which operate to inhibit rotational movement of the hollow cylindrical main spindle 44 on the main base structure 21 while permitting limited movement of the hollow cylindrical main spindle 44 and associated sub-base plate 40 along coordinate X and Y axes on the main base structure 21 under control of the micromanipulator mechanism 23.

Manipulation of the joy stick handle 61 by the operator in any direction about its pivot bearing 62 results in a follower type operation by the two manipulator links 86 and 87 about the shaft 88, moving the main spindle 44 via manipulator rings 93 and 94. This results in an X-Y positioning movement of the sub-base plate 40 in the swivel sub-base assembly and a positioning of the associated transistor strip indexing mechanism 27 under the capillary wire bonding tip 163 as viewed through the microscope 25 by the operator. Thus, the movable sub-base assembly 22 follows the operator's movement of the joy stick and permits the positioning of the heater unit, which carries the multi-unit transistor strip, such that the first bonding pad 36 on the die of the first transistor unit on the transistor strip may be aligned directly under the capillary wire bonding tip 163. Once the first bonding pad on the die of the first transistor unit has been properly positioned under the capillary wire bonding tip 163 by the micromanipulator mechanism 23, the operator initiates operation of the wire bonding machine which then proceeds to automatically produce the desired wire bonds between the bonding pads 36 and 37 and the terminal members 34 and 35, respectively, of the first transistor unit.

The wire bonding machine automatically indexes each transistor unit on the transistor strip in sequence under the capillary wire bonding tip 163 so as to bond two wires to each transistor unit, the transistor strip automatically moving from the left-hand transistor strip magazine in step-wise fashion across the heater unit and into the right-hand transister strip magazine. After completion of the wire bonds to each of the transistor units on the first transistor strip, the operator feeds the second transistor strip from the left-hand transistor strip magazine onto the heater unit so as to bond two wires to each transistor unit thereon in succession.

Figure 4:
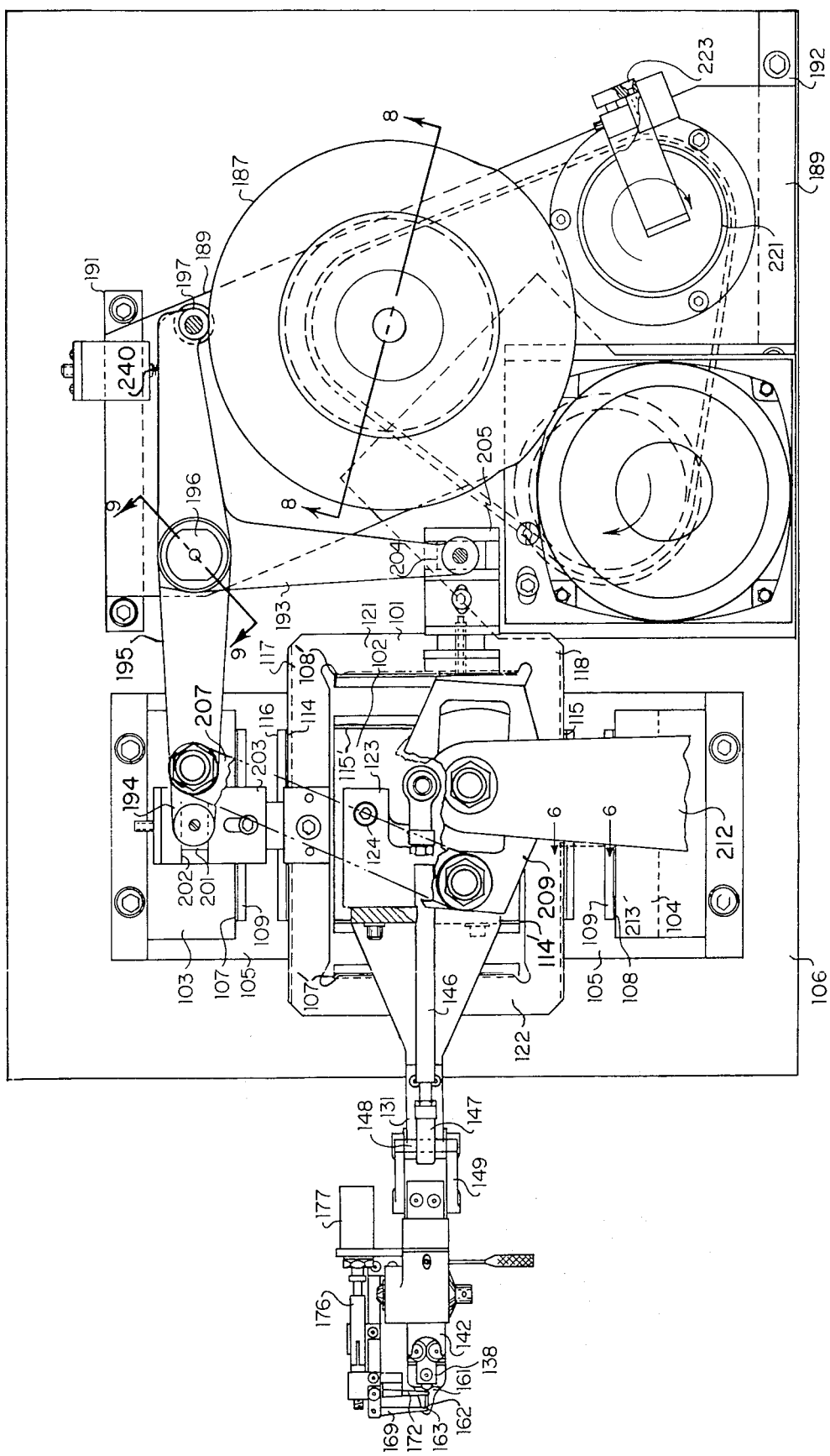
FIG. 4 is a plan view of the wire bonding tool, the vertical Z-axis motion control mechanism therefor, the horizontal X-Y stage on which the wire bonding tool is mounted, and the horizontal X and Y-axes motion control mechanism therefor employed in the wire bonding machine of FIGS. 1 and 2.
Figure 5:
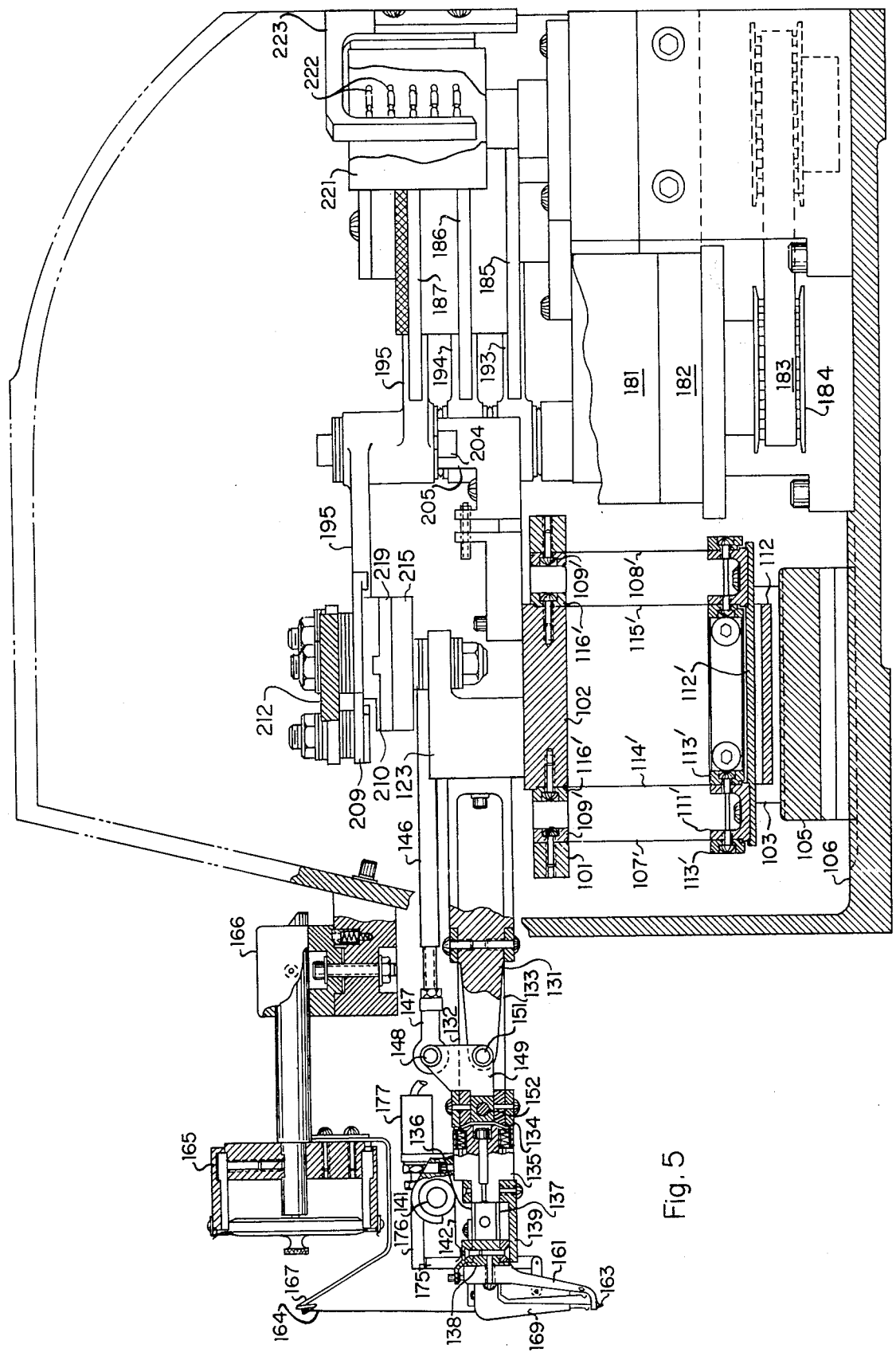
FIG. 5 is a side view partly in cross section of the apparatus of FIG. 4.
Figure 6:
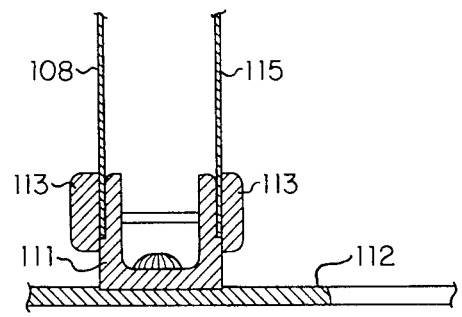
FIG. 6 is a cross-sectional view of a portion of one of the reed structures employed in the X-Y stage for the wire bonding tool as taken along section line 6—6 in FIG. 4.

Referring now to FIGS. 4, 5, and 6, the wire bonding tool holder mechanism 24 includes an X-Y stage comprising a compound reed assembly, a first reed structure of this assembly serving to support a rectangular top frame 101 from a fixed base support structure and a second reed structure of this assembly being supported within the top frame 101 and carrying a ram mounting plate 102 thereon. Since these two reed structures are very similar in construction, the reference numerals used for the elements of the first reed structure will also be used for the elements of the second reed structure, the latter reference numerals being primed.

The first reed structure of the compound reed assembly comprises a pair of reed hangers 103 and 104 fixedly secured in spaced-apart fashion on a support member 105 which is in turn fixedly mounted on the floor 106 of the main base structure 21. Two flexible outer reeds 107 and 108 are secured at their upper edge portions to the reed hangers 103 and 104, respectively, by reed caps 109, the reeds 107 and 108 hanging down from their associated reed hangers and carrying at their lower edge portions two associated reed spacers 111. These two reed spacers 111 are fixedly secured together by means of a spacer separator member 112 and reed caps 113. Two similar flexible inner reeds 114 and 115 are secured at their lower edge portions to the two reed spacers 111, the reeds 114 and 115 extending upwardly from the reed spacers 111 and being fixedly secured at their upper edge portions by reed caps 116 to the outer surfaces of two oppositely facing sides 117 and 118, respectively, of the top frame 101. By a flexing of the two pairs of reeds 107, 114 and 108, 115 the top frame 101 may float or move in a direction generally normal to the faces of those reeds (i.e., in the X direction).

The second reed structure of the compound reed assembly comprises two flexible outer reeds 107' and 108' hung at their upper edge portions from the inner surfaces of the other two oppositely facing sides 121 and 122 of the top frame 101. The lower edge portions of these two reeds 107' and 108' carry two reed spacers 111' and a spacer separator member 112'. Two similar flexible inner reeds 114' and 115' extend upwardly from the two reed spacers 111' and carry at their upper edge portions the mounting plate 102 on which a ram mounting block 123 is fixedly mounted by screws 124. The mounting plate 102 and, hence, the ram mounting block 123 float on this second reed structure and may move in a direction within the top frame 101 generally normal to the direction of movement of the top frame 101 on the first reed structure (i.e., in the Y direction). Thus, the compound reed assembly provides for floating movement of the ram mounting block 123 in an X-Y coordinate system in any direction depending on the relative movements of the top frame 101 on the first reed structure and the mounting plate 102 on the second reed structure within the top frame 101.

A ram or bonding tool support arm 131 is fixedly secured to the front side of the ram mounting block 123 and extends outwardly through an opening in the front wall of the housing of the wire bonding machine. Each of a first pair of spaced-apart, parallel, flexible reeds 132 and 133 is fixedly secured at one end to the ram 131 and fixedly secured at the other end by means of a reed bracket 134 to a swing block 135. Each of a second pair of spaced-apart, parallel, flexible reeds 136 and 137 is fixedly secured at one end to the swing block 135 and extends forwardly therefrom and into fixed engagement at the other end with a bonding tool holder fork 138.

A reed block member 139 extending from the swing block 135 serves to limit the downward extent of travel of the bonding tool holder fork 138 on the ends of the two reeds 136 and 137. By a flexing of the two reeds 136 and 137 the bonding tool holder fork 138 may move upwardly from the reed block member 139. The outer end of a spring 142 of a spiral spring assembly 141 mounted on the swing block 135 exerts a yieldable force on the bonding tool holder fork 138 urging it to a normal rest position against the reed block member 139.

A push rod 146, movably mounted on the ram mounting block 123 as described below, extends out over the top of the ram 131. One end 147 of the push rod 146 is pivotally secured to a first pivot pin 148 of a bell crank 149. The bell crank 149 is in turn pivotally secured by a second pivot pin 151 to the free end of the ram 131 and by a third pivot pin 152 to swing block 135. A vertical Z-axis motion control mechanism coupled to the other end of the push rod 146 (see FIG. 10) urges the push rod 146 to a longitudinal position for which the bonding tool holder fork 138 is held at a normal raised horizontal level.

The bonding tool holder 161 is fixedly secured on the outer end of the bonding tool holder fork 138, the bonding tool holder 161 extending in a generally downward direction to a tip portion 162. This tip portion 162 carries the cylindrical, vertically-extending, capillary wire bonding tip 163 through which the wire 164 to be bonded is fed vertically downward onto the bonding surface. The wire 164 is carried on a wire spool mechanism 165 rotatably mounted by a suitable bracket mechanism 166 on the front surface of the housing of the wire bonding machine, the wire being fed from the rotatable spool mechanism 165, through a wire guide 167, and then verticallly downward through the capillary wire bonding tip 163 of the bonding tool holder 161.

Figure 7:
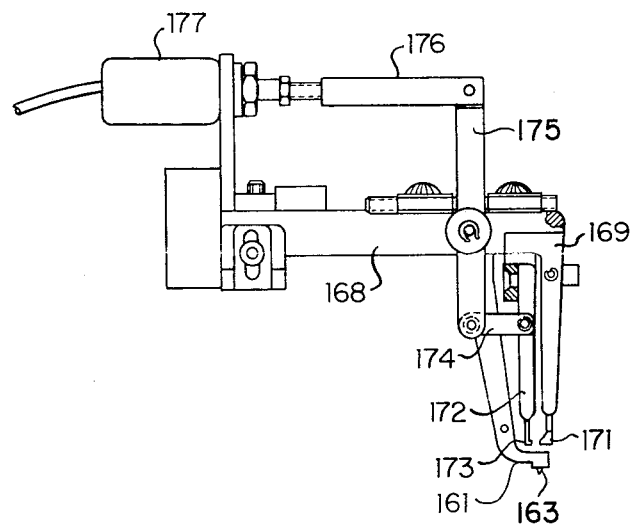
FIG. 7 is a side view of the wire holder assembly of the wire bonding tool looking from the side opposite that shown in FIG. 5 and illustrating more clearly the wire clamping mechanism of the wire bonding tool.

A wire clamping mechanism is fixedly secured on the swing block 135. As best shown in FIG. 7, this mechanism comprises a horizontally extending wire clamp member 168 having a stationary wire clamp member 169 affixed to the outer end thereof. The stationary wire clamp member 169 extends downwardly and terminates in a clamping tip 171 positioned just above the capillary wire bonding tip 163 of the bonding tool holder 161. A flexing wire clamp member 172 is hung by a reed mounting from the lower side of wire clamp member 168. This flexing wire clamp member 172 terminates in a clamping tip 172 designed to engage the clamping tip 171 of the stationary wire clamp member 169 to fixedly clamp the wire just above the capillary wire bonding tip 163. The flexing wire clamp member 172 is pivotally secured to a connecting arm 174, the outer end of the connecting arm 174 being pivotally secured to the lower end of a lever arm 175 that is pivotally mounted on the wire clamp member 168. The upper end of the lever arm 175 is pivotally secured to a solenoid rod 176 that is operated in a push-pull fashion by an electrical solenoid 177. When the solenoid 177 is operated, it moves the clamping tip 173 of the flexing wire clamp member 172 into engagement with the mating stationary clamping tip 171 to clamp the wire. Deenergization of the solenoid 177 relaxes the flexing wire clamp member 172 and permits freedom of movement of the wire through the capillary wire bonding tip 163.

Figure 8:
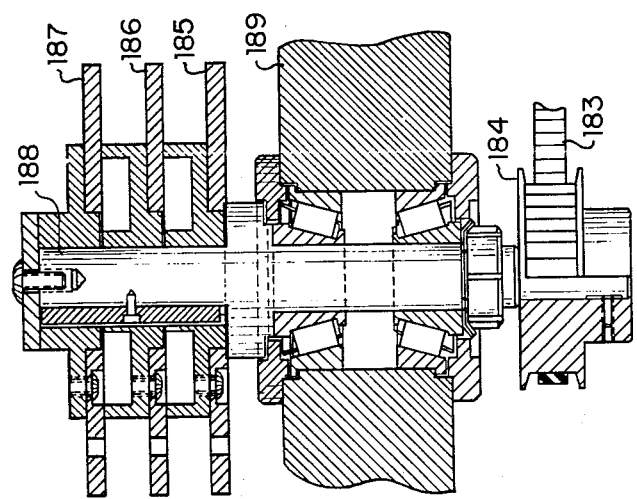
FIG. 8 is a cross-sectional view of the cam assembly of the control mechanisms for the wire bonding tool and the horizontal X-Y stage therefor as taken along section line 8—8 in FIG. 4.

Referring again to FIGS. 4 and 5, the horizontal X and Y-axes motion control mechanism for the X-Y stage on which the bonding tool is mounted and the vertical Z-axis motion control mechanism for the bonding tool holder 161 include a motor 181 mounted on a motor riser block 182 on the floor 106 of the main base structure 21. A timing belt 183 and a sprocket 184 driven by the motor 181 drives a Y-axis cam 185, an X-axis cam 186, and a Z-axis or loop cam 187. As best shown in FIGS. 4 and 8, these cams are fixedly secured on a main shaft 188 rotatably mounted in a bearing block 189 carried by two end support members 191 and 192 on the main base structure 21 of the wire bonding machine.

Figure 9:
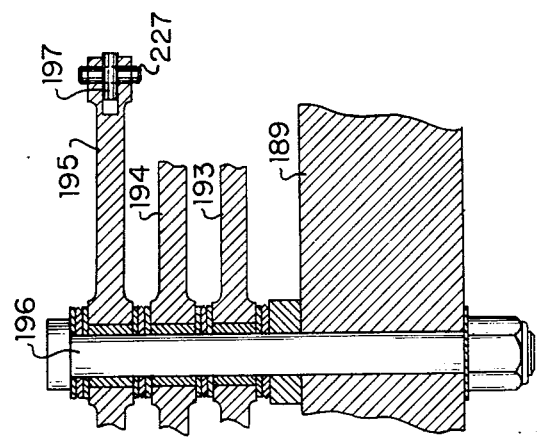
FIG. 9 is a cross-sectional view of the cam arm assembly of the control mechanisms for the wire bonding tool and the horizontal X-Y stage therefor as taken along section line 9—9 in FIG. 4.

A Y-axis cam arm 193, an X-axis cam arm 194, and a Z-axis or loop cam arm 195 are rotatably mounted on a pivot pin 196 secured in the main bearing block 189 as best shown in FIGS. 4 and 9. A separate bearing 197 is rotatably mounted at one end of each of these cam arms and held in engagement with the peripheral surface of the corresponding one of the cams 185, 186, and 187 by a separate spring 240 so that the cam arms pivot about the pivot pin 196 in response to variations in the peripheral surfaces of the corresponding cams. The other end of the X-axis cam arm 194 carries a pivotally mounted slide member 201 that is slidably positioned within a corresponding slide way 202 in an X-axis position guide 203 fixedly secured to the top frame 101. Pivoting motion of the X-axis cam arm 194 about the pivot pin 196 in response to the variations in the peripheral surface of the X-axis cam 186 results in a tracking movement of the X-axis position guide 203 and, hence, in movment of the top frame 101 in the X direction. Similarly, the other end of the Y-axis cam arm 193 carries a pivotally mounted slide member 204 that is slidably positioned within a corresponding slide way in a Y-axis position guide 205 fixedly secured to the mounting plate 102. In response to variations in the peripheral surface of the Y-axis cam 185, the Y-axis cam arm 193 serves to move the mounting plate 102 and, hence, the ram mounting block 123 within the top frame 101 in the Y direction (i.e., normal to the X direction movement of the top frame 101).

Figure 10:
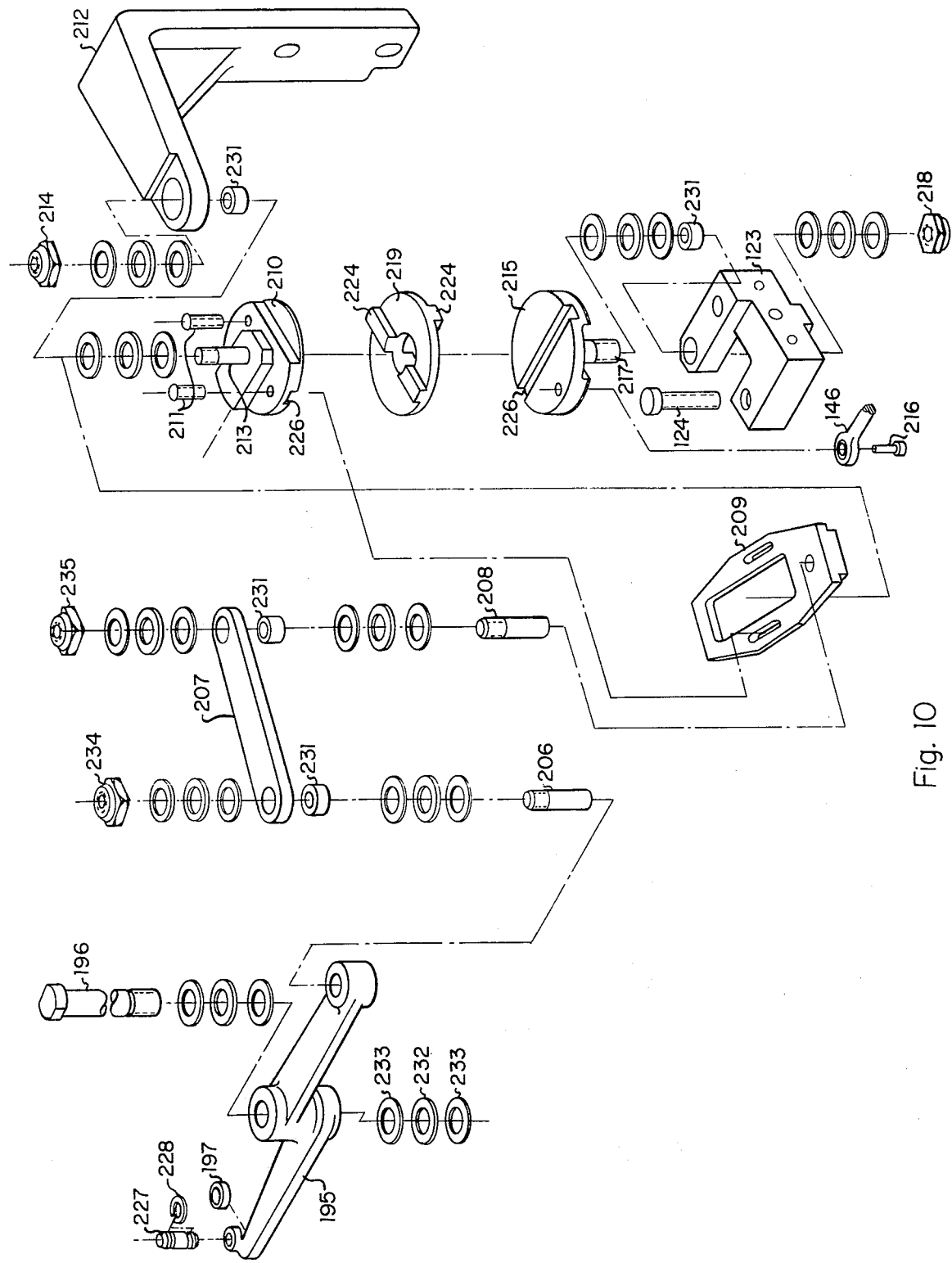
FIG. 10 is an exploded assembly view of the vertical Z-axis motion control mechanism of FIGS. 4 and 5.

As best shown in FIGS. 4 and 10, the other end of the Z-axis or loop cam arm 195 is pivotally coupled by a pivot pin 206 and a lock nut 234 screwed onto a threaded upper end portion of the pivot pin 206 to one end of a link 207. The other end of the link 207 is in turn pivotally coupled by a pivot pin 208 and a lock nut 235 screwed onto a threaded upper end portion of the pivot pin 208 to one end of a drive arm 209 fixedly secured to an upper coupling member 210 by screws 211. This upper coupling member is rotatably mounted on a bracket 212 by a pivot pin 213 and a lock nut 214 screwed onto a threaded upper end portion of the pivot pin 213. Bracket 212 is fixedly secured to a rigid portion of the wire bonding machine adjacent to the X-Y stage supporting the ram mounting block 123 and the ram 131 secured thereto. The end of the push rod 146 remote from the bell crank 149 is pivotally coupled to a lower coupling member 215 by a pivot pin 216. This lower coupling member is rotatably mounted on the ram mounting block 123 by a pivot pin 217 and a lock nut 218 screwed onto a threaded lower end portion of the pivot pin 217.

The upper coupling member 210, the lower coupling member 215, and an intermediate coupling member 219 form an Oldham coupling mechanism in which a pair of slides 224 oriented in the orthogonal X and Y directions on the upper and lower surfaces of the intermediate coupling member 219 are slidably engaged in a corresponding pair of slideways 226 orthogonally oriented in the X and Y directions on the lower surface of the upper coupling member 210 and on the upper surface of the lower coupling member 215. This permits the top frame 101 and the mounting plate 102 to be moved in the X and Y directions, under control of the X and Y-axes cams 186 and 185, to adjust the horizontal position of the capillary wire bonding tip 163 and wire 164 in the X and Y directions without rotating the upper and lower coupling members 210 and 215 and, hence, without affecting the vertical position of the capillary wire bonding tip 163 and wire 164 in the Z direction. Moreover, rotation of the upper coupling member 210 by the Z-axis or loop cam arm 195 and link 207, under control of the Z-axis or loop cam 187, rotates the lower coupling member 215 and thereby moves the push rod 146 in the Y direction as required to pivot the bell crank 149 about the pivot pin 151, flex the two reeds 132 and 133, and precisely adjust the vertical position of the capillary wire bonding tip 163 and wire 164 in the Z direction on the end of the ram 131.

As shown in FIG. 10, the bearing 197 for engaging the peripheral surface of the Z-axis or loop cam is rotatably mounted at a bifurcated end of the Z-axis or loop cam arm 195 by a mounting pin 227 and a pair of spring clips 228 (only one of which is shown). The bearings 197 for engaging the peripheral surfaces of the X and Y-axes cams are similarly mounted on bifurcated ends of the X and Y-axes cam arms, respectively. The remaining previously unmentioned parts shown on FIG. 10 comprise needle bearings 231, thrust bearings 232, and thrust bearing washers 233 for pivot pins 196, 206, 208, 213, and 217.

In addition to driving the cams 185, 186, and 187, the motor 181 drives a cylindrical timing drum 221 which has a plurality of light sources 222 mounted therein and a corresponding plurality of photodetecters (not shown) aligned with the light sources and mounted externally of the timing drum in a housing 223 (see FIGS. 4 and 5). Horizontal slots positioned in the timing drum 221 between the individual light sources 222 and the corresponding photodetectors serve to establish optoelectronic circuit connections between the light sources and the photodetectors. As the motor 181 rotates the cams 185, 186, and 187, the timing drum 221 also rotates, making and breaking various optoelectronic circuit connections during specified segments of each complete revolution of the cams.

Figure 11:
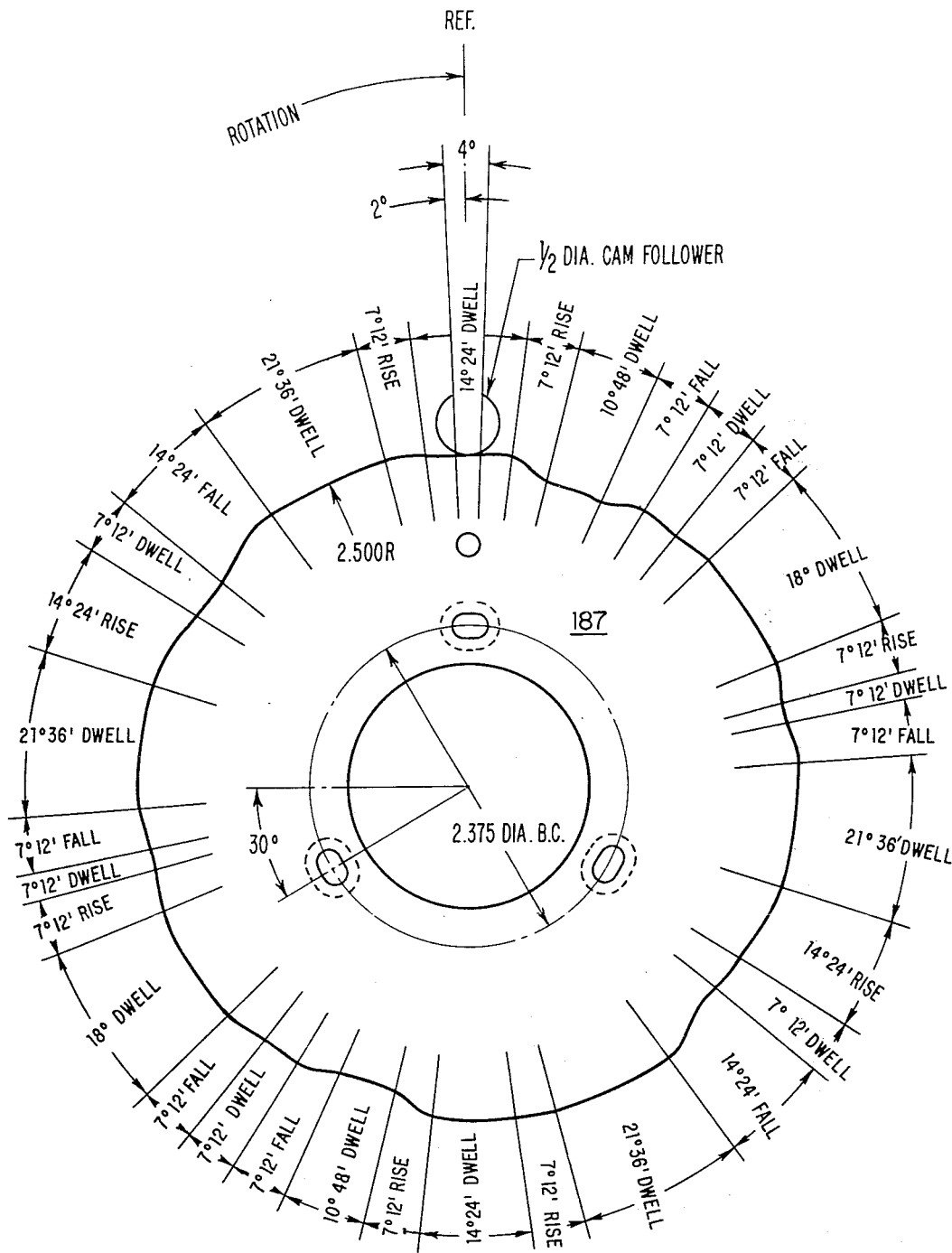
FIG. 11 is a plan view of a typical form of loop cam utilized with the vertical Z-axis motion control mechanism of FIG. 10.
Figure 12:
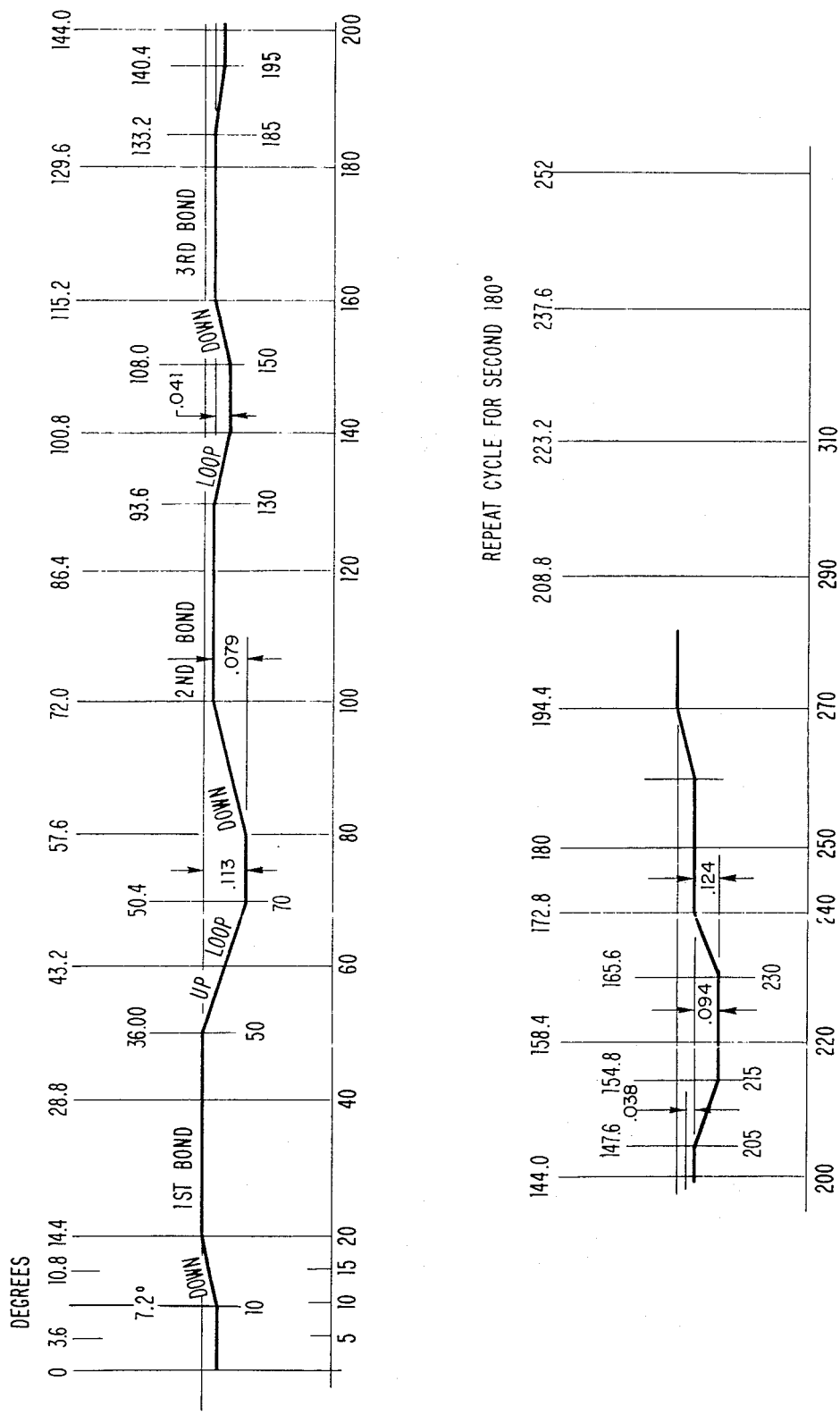
FIG. 12 is a timing diagram for the loop cam of FIG. 11.

A typical form of Z-axis or loop cam 187 is shown in FIG. 11. The timing diagram for this cam is shown in FIG. 12. As can be seen in the timing diagram, there are three wire bonding periods within the first 180° rotation of the Z-axis or loop cam 187 with a wire looping period between the first and second wire bonding periods and another wire looping period between the second and third wire bonding periods. A wire bond is made to the first bonding pad 36 on the die 33 and stitch bonds are made to the first terminal member 34 of the transistor unit shown in FIG. 3 during these wire bonding and looping periods. After the third wire bonding period there is a dwell period during which the X and Y-axes cams 186 and 185 operate to move the capillary wire bonding tip 163 and wire 164 from the last bond on the first terminal member 34 to a position just above the second bonding pad 37 on the die 33 of the same transistor unit. During the second 180° rotation of the Z-axis or loop cam 187 there are an additional three wire bonding periods with a wire looping period between the first and second wire bonding periods and another wire looping period between the second and third wire bonding periods. A wire bond is made to the second bonding pad 37 and stitch bonds to the second terminal member 35 during these wire bonding and looping periods. After the third wire bonding period of the second 180° rotation of the Z-axis or loop cam, there is another dwell period during which the X and Y-axes cams 186 and 185 operate to move the capillary wire bonding tip 163 and wire 164 back to a position over the first bonding pad 36. During this dwell period the indexing mechanism of the wire bonding machine also moves the next transistor unit into place under the capillary wire bonding tip 163 and wire 164.

Referring again to FIGS. 3, 4, and 5, the X and Y-axes cams 186 and 185 are specifically designed for the purpose of operating the corresponding X and Y-axes cam arms 194 and 193 to move the X-Y stage on which the ram mounting block 123 is mounted as required to position the capillary wire bonding tip 163 and wire 164 over the bonding areas to which the bonds are to be made. The peripheral surfaces of the X and Y-axes cams 186 and 185 are specially formed to provide the exact direction and distance of movement called for by the particular transistor units to be bonded by the wire bonding machine and to provide the needed dwell times for bonding. For the transistor unit shown in FIG. 3, the first bond is made to the bonding pad 36 during a first dwell period. Rotation of the X and Y-axes cams 186 and 185 then moves the capillary wire bonding tip 163 and wire 164 to the first bonding point on the terminal member 34 where the first bond to that terminal member is made and thereafter moves the capillary wire bonding tip 163 and wire 164 to to the second bonding point on the terminal member 34 where the second bond to that terminal member is made. At this time, the timing drum 221 functions to close an optoelectronic circuit to the wire clamping solenoid 177 which thereupon operates to clamp the bonding wire between the clamping tips 171 and 173 just above the capillary wire bonding tip 163. Thus, as the bonding tool holder 161 is raised away from the second bond on the terminal member 34 by the push rod 146, the wire 164 is pulled and broken, leaving a short tail portion extending below the capillary wire bonding tip 163. This tail portion then serves as the wire portion to be bonded to the second bonding pad 37 on the die 33 when the capillary wire bonding tip 163 has been properly positioned over that bonding pad by rotation of the X and Y-axes cams 186 and 185. During the second half of the revolution of the X and Y-axes cams, the capillary wire bonding tip 163 is moved from the bonding pad 37 after a bond is made thereto and is successively positioned over the first and second bonding points on the terminal member 35 where the stitch bonding is performed. After the last bond on the terminal member 35, the wire clamping mechanism again operates to clamp the wire so that it is broken as the bonding tool holder 161 is raised from the terminal member 35 and returned to the dwell position over the first bonding pad 36. The complete cycle is then repeated to produce the necessary wire bonding on the next transistor unit indexed into place. Indexing of each transistor unit into the proper position under the wire bonding tool is initiated by the time drum 221 and the associated optoelectronic circuit.

I claim:

1. Apparatus comprising a base structure; holder means mounted on the base structure for supporting a workpiece; an X-Y stage mounted on the base structure for movement along coordinate X and Y axes; first control means coupled to the X-Y stage for controlling movement thereof along the coordinate X and Y axes; a support arm fixedly mounted on the X-Y stage; a tool mounted on the support arm for movement along a coordinate Z axis towards and away from the workpiece supported on the holder means; and second control means, including a rotatable coupling mechanism with a plurality of positively coupled rotatable members one of which is pivotally coupled to the tool, for positively controlling movement of the tool along the coordinate Z axis independently of movement of the X-Y stage along the coordinate X and Y axes.

2. Apparatus as in claim 1 wherein said coupling mechanism includes a first coupling member rotatably mounted on the base structure adjacent to the X-Y stage; and a second coupling member rotatably mounted on the X-Y stage, positively coupled to and driven by the first coupling member, and pivotally coupled to the tool.

3. Apparatus as in claim 2 wherein said coupling mechanism includes a third coupling member positioned between and positively coupled to the first and second coupling members; and said first, second, and third coupling members include means for positively rotating the second coupling member with the first coupling member and for permitting movement of the X-Y stage along the coordinate X and Y axes without rotating the first and second coupling members.

4. Apparatus as in claim 3 wherein said second control means includes a first linkage mechanism pivotally coupled to the first coupling member for positively rotating the first coupling member; and a second linkage mechanism pivotally coupled to both the second coupling member and the tool for positively moving the tool along the coordinate Z axis in response to rotation of the first coupling member.

5. Apparatus as in claim 4 wherein said first linkage mechanism comprises a follower arm, and a link pivotally coupled at one end to the follower arm and pivotally coupled at the other end to the first coupling member; and said second linkage mechanism comprises a push rod pivotally coupled at one end to the second coupling member and pivotally coupled at the other end to the tool.

6. Apparatus as in claim 5 wherein said tool is coupled to the support arm by a pair of flexible reeds and by a bell crank; and said push rod is pivotally coupled at said other end thereof to the bell crank.

7. Apparatus as in claim 6 wherein said means for rotating the second coupling member with the first coupling member and for permitting movement of the X–Y stage along the coordinate X and Y axes without rotating the first and second coupling members comprises a pair of slides orthogonally oriented along a pair of oppositely facing surfaces of the third coupling member, and a corresponding pair of slideways orthogonally oriented along the adjoining surfaces of the first and second coupling members.

8. Apparatus as in claim 7 wherein said first control means comprises a pair of cam-operated follower arms coupled to the X–Y stage; and said follower arm of the first linkage mechanism of the second control means comprises a camoperated follower arm.

9. Apparatus as in claim 8 wherein said tool comprises a wire bonding tool; and said holder means comprises another X-Y stage mounted on the base structure beneath the wire bonding tool.

10. Apparatus as in claim 9 wherein said bell crank is pivotally coupled to a swing block; and said wire bonding tool is coupled to said swing block by another pair of flexible reeds.

11. Apparatus as in claim 6 wherein said bell crank is pivotally coupled to a swing block; and said tool is coupled to said swing block by another pair of flexible reeds.

12. Apparatus as in claim 3 wherein said means for rotating the second coupling member with the first coupling member and for permitting movement of the X-Y stage along the coordinate X and Y axes without rotating the first and second coupling members comprises a pair of slides orthogonally oriented along the coordinate X and Y axes on a pair of opposite facing surfaces of the third coupling member, and a corresponding pair of slideways orthogonally oriented along the coordinate X and Y axes on the adjoining surfaces of the first and second coupling members.

13. Apparatus as in claim 3 wherein said tool comprises a wire bonding tool; and said holder means comprises another X-Y stage mounted on the base structure beneath the wire bonding tool.

14. Apparatus as in claim 3 wherein said first control means comprises a pair of cam-operated follower arms coupled to the X-Y stage; and said follower arm of the first linkage mechanism of the second control means comprises a cam-operated follower arm.

15. Apparatus as in claim 3 wherein said means for rotating the second coupling member with the first coupling member and for permitting movement of the X-Y stage along the coordinate X and Y axes without rotating the first and second coupling members comprises a first slide and a corresponding first slideway oriented along a pair of adjoining oppositely-facing surfaces of the coupling members, and a second slide and a corresponding second slideway oriented along another pair of adjoining oppositely-facing surfaces of the coupling members.

16. Apparatus as in claim 15 wherein said first and second slides are oriented along a pair of oppositely-facing surfaces of the third coupling member, and the corresponding first and second slideways are oriented along the adjoining surfaces of the first and second coupling members.

17. Apparatus as in claim 16 wherein said first slide and corresponding first slidway are oriented along a first axis, and the second slide and corresponding second slideway are oriented along a second axis orthogonal to the first axis.

18. Apparatus as in claim 15 wherein said first slide and corresponding first slideway are oriented orthogonal to the second slide and corresponding second slideway.

19. Apparatus as in claim 3 wherein said means for rotating the second coupling member with the first coupling member and for permitting movement of the X-Y stage along the coordinate X and Y axes without rotating the first and second coupling members comprises means disposed along a pair of adjoining oppositely-facing surfaces of the coupling members for permitting movement of the X-Y stage along one of the coordinate X and Y axes without rotating the first and second coupling members, and means disposed along another pair of adjoining oppositely-facing surfaces of the coupling members for permitting movement of the X-Y stage along the other of the coordinate X and Y axes without rotating the first and second coupling members.

20. Apparatus as in claim 19 wherein said means for permitting movement of the X-Y stage along said one of the coordinate X and Y axes without rotating the first and second coupling members is oriented orthogonal to said means for permitting movement of the X-Y stage along said other of the coordinate X and Y axes without rotating the first and second coupling members.

* * * * *